(12) United States Patent
Lim

(10) Patent No.: US 8,039,899 B2
(45) Date of Patent: Oct. 18, 2011

(54) ELECTROSTATIC DISCHARGE PROTECTION DEVICE

(75) Inventor: Dong-Ju Lim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 322 days.

(21) Appl. No.: 12/473,334

(22) Filed: May 28, 2009

(65) Prior Publication Data

US 2009/0294855 A1 Dec. 3, 2009

(30) Foreign Application Priority Data

May 28, 2008 (KR) .................. 10-2008-0049878

(51) Int. Cl.
*H01L 23/62* (2006.01)
(52) U.S. Cl. ................. 257/355; 257/E29.024
(58) Field of Classification Search .................. 257/213, 257/288, 355–363, E29.024, 29.025, E29.026
See application file for complete search history.

(56) References Cited

U.S. PATENT DOCUMENTS

| | | | |
|---|---|---|---|
| 6,465,848 B2 | 10/2002 | Ker et al. | |
| 6,858,902 B1 * | 2/2005 | Salling et al. | 257/360 |
| 6,970,335 B1 | 11/2005 | Vashchenko et al. | |
| 7,061,051 B2 | 6/2006 | Yu | |
| 7,126,168 B1 | 10/2006 | Vashchenko et al. | |
| 2002/0050615 A1 | 5/2002 | Ker et al. | |

FOREIGN PATENT DOCUMENTS

| | | |
|---|---|---|
| JP | 2008-538259 | 10/2008 |
| KR | 1020010091429 | 10/2001 |
| KR | 1020020015199 | 2/2002 |
| KR | 1020060038235 | 5/2006 |
| KR | 1020060078152 | 7/2006 |
| WO | WO-2007/040612 A2 | 4/2007 |

OTHER PUBLICATIONS

Notice of Allowance issued from Korean Intellectual Property Office on Jul. 28, 2010.

* cited by examiner

*Primary Examiner* — Ha Tran T Nguyen
*Assistant Examiner* — Kevin Quinto
(74) *Attorney, Agent, or Firm* — IP & T Group LLP

(57) ABSTRACT

An electrostatic discharge protection device includes a first well comprising a MOS transistor; a second well comprising a first impurity region to which a first voltage is applied, and a second impurity region connected to an input/output pad, the second well being disposed adjacent to the first well; and a third well comprising a third impurity region to which the first voltage is applied, the third well being disposed adjacent to the second well.

22 Claims, 3 Drawing Sheets

ELECTROSTATIC DISCHARGE PROTECTION DEVICE

CROSS-REFERENCE TO RELATED APPLICATIONS

The present invention claims priority of Korean patent application number 10-2008-0049878, filed on May 28, 2008, the disclosure of which is incorporated by reference herein in its entirety.

BACKGROUND OF THE INVENTION

The present invention relates to a semiconductor device, and more particularly, to an electrostatic discharge (ESD) protection device for protecting internal circuits from ESD.

ESD is the sudden electric current flowing between two insulating objects when placed under a large electric potentials caused by direct electrical contact.

When a high voltage caused by ESD flows into semiconductor devices, internal circuits may be damaged. Thus, most semiconductor devices include an ESD protection device between a pad and an internal circuit in order for protecting the internal circuit from being damaged.

As semiconductor devices are being operated at higher speeds and highly integrated, a low pin capacitance may be required and a gate dielectric layer is getting thinner.

Junction capacitors of a semiconductor device occupy more than 50% of the pin capacitance. In particular, a parasitic junction capacitance of an ESD protection device located at an input/output pad occupies a significant portion of the pin capacitance. Since the pin capacitance has a negative influence on signal input/output speed and signal retention, a reduction in the pin capacitance is desired in high-speed products. Much effort has been made to reduce a parasitic junction capacitance of an ESD protection device.

One such attempt has been to use a silicon controlled rectifier (SCR) as an ESD protection device that has high ESD efficiency and may reduce parasitic capacitance by a junction region.

Since the junction region of the SCR has an N-well and a P-well, parasitic junction capacitance is small and a large ESD current is discharged even in a small area due to operations of two parasitic bipolar transistors.

However, when an SCR operating at a high voltage is used as an ESD protection device, a gate dielectric layer of an internal circuit may be damaged before operation of the SCR because the gate dielectric layer of the semiconductor device in high-speed, high-integrated products is getting thinner and the breakdown voltage of the gate dielectric layer is also decreasing.

Thus, a low voltage triggered SCR (LVTSCR) operating at a lower voltage than the SCR has been used.

FIG. 1 is a circuit diagram of a typical ESD protection device using an LVTSCR. Referring to FIG. 1, the typical ESD protection device includes an SCR 10 and an NMOS transistor 12. The SCR 10 includes two parasitic bipolar transistors Q1 and Q2 connected between an input/output (I/O) pad and a ground voltage pad VSS in a latch structure. The NMOS transistor 12 is connected between a base of the parasitic bipolar transistor Q2 and the ground voltage pad VSS in order to reduce an operating voltage of the SCR 10.

The typical ESD protection device can reduce the operating voltage down to the breakdown voltage of the NMOS transistor 12, while maintaining a relatively superior ESD effect.

However, when a negative ESD is applied, the typical ESD protection device does not maintain the relatively superior characteristic of SCR.

FIG. 2 is a cross-sectional view of the typical ESD protection device of FIG. 1. Referring to FIG. 2, an N-well 21 is formed in a P-well 20. An NMOS transistor having N-type impurity regions 23 and 25 and a gate 24, and a P-type impurity region 22 for applying a bias voltage to the P-well 20 are formed in the P-well 20. A device isolation layer (STI) is formed between the NMOS transistor and the P-type impurity region 22. N-type impurity regions 25 and 27 and a P-type impurity region 26 are formed in the N-well 21. The N-type impurity region 25 corresponding to a drain of the NMOS transistor is formed over the P-well 20 and the N-well 21.

As illustrated in FIG. 2, a parasitic NPN bipolar transistor Q1 is formed in the P-well 20, and a parasitic PNP bipolar transistor Q2 is formed in the N-well 21. Due to these wells 20 and 21, resistors RP and RN exist.

When excessive ESD is applied to the input/output pad, electron hole pair is generated by junction breakdown in reverse junction of the N-type impurity region 25 and the P-type impurity region 22 having the same potential as the N-well 21. The generated holes move to the P-type impurity region 26, and the generated electrons move to the N-type impurity region 23. Thus, a voltage rise and a voltage drop occur across the resistor RP of the P-well 20 and the resistor RN of the N-well 21, respectively. As a result, the parasitic bipolar transistors Q1 and Q2 are turned on. In this case, even if either of the parasitic bipolar transistors Q1 and Q2 is turned on, the ESD protection device changes to a low impedance state by a positive feedback, and performs an SCR operation to make a large current flow.

However, when negative ESD is applied, parasitic diodes are operated. For example, an excessive ESD voltage may be applied to the ground voltage terminal VSS. In this case, the P-type impurity region 22 functions as an anode, and the N-type impurity region 27 functions as a cathode. Thus, a parasitic diode is formed. Since a current drivability of the diode is inferior to the SCR, the ESD device may not operate normally when a relatively large negative ESD current is applied, resulting in damage of the internal circuit.

That is, although the SCR has a high ESD protection capability, the ESD capability of the SCR may be limited by characteristics of a diode formed when a negative ESD current is applied.

SUMMARY OF THE INVENTION

Embodiments of the present invention are directed to providing an electrostatic discharge (ESD) protection device including an SCR, which is capable of improving current characteristics of parasitic diodes even when negative ESD current is applied.

In accordance with an aspect of the present invention, there is provided an electrostatic discharge protection device, including: a first well comprising a MOS transistor; a second well comprising a first impurity region to which a first voltage is applied, and a second impurity region connected to an input/output pad, the second well being disposed adjacent to the first well; and a third well comprising a third impurity region to which the first voltage is applied, the third well being disposed adjacent to the second well.

The first well may further include a fourth impurity region to which the first voltage is applied.

The second well may further include a fifth impurity region adjacent to a drain region of the MOS transistor and connected to the input/output pad.

The electrostatic discharge protection device may further include a first device isolation layer disposed between the first impurity region and the fourth impurity region; and a second device isolation layer disposed between the first impurity region and the second impurity region.

The electrostatic discharge protection device may further include a third device isolation layer disposed between the second impurity region and the third impurity region.

The first impurity region and the third impurity region have a width ranging from approximately 0.4 μm to approximately 2 μm, and the second impurity region has a width ranging from approximately 0.7 μm to approximately 2 μm.

An interval of the impurity may region ranges from approximately 0.6 μm to approximately 1 μm.

The first well and the third well may each be a P-well, and the second well is an N-well.

The first impurity region and the third impurity region may each be a P-type impurity region, and the second impurity region is an N-type impurity region.

The fourth impurity region may be a P type impurity region.

The fifth impurity region may be a P-type impurity region.

The first voltage may be a ground voltage.

The first impurity region and the third impurity region may each be an N-type impurity region, and the second impurity region is a P-type impurity region.

The fourth impurity region may be an N-type impurity region.

The fifth impurity region may be an N-type impurity region.

The first voltage may be a power supply voltage.

In accordance with another aspect of the present invention, there is provided an electrostatic discharge protection device, including: a first P-well disposed over a semiconductor substrate; an N-well disposed adjacent to the first P-well; a second P-well disposed adjacent to the N-well; a first P-type impurity region disposed in the first P-well and to which a ground voltage is applied; an NMOS transistor disposed in the first P-well and comprising a first N-type impurity region to which the ground voltage is applied, a second N-type impurity region disposed over the first P-well and the N-well, and a gate to which the ground voltage is applied; a second P-type impurity region disposed adjacent to the second N-type impurity region in the N-well and connected to an input/output pad; a third P-type impurity region disposed in the N-well and to which the ground voltage is applied; a third N-type impurity region disposed in the N-well and connected to the input/output pad; and a fourth P-type impurity region disposed in the second P-well and to which the ground voltage is applied.

The third P-type impurity region and the fourth P-type impurity region may have a width ranging from approximately 0.4 μm to approximately 2 μm, and the third N-type impurity region has a width ranging from approximately 0.7 μm to approximately 2 μm.

An interval of the third P-type impurity region, the third N-type impurity region, and the fourth P-type impurity may region ranges from approximately 0.6 μm to approximately 1 μm.

In accordance with still another aspect of the present invention, there is provided an electrostatic discharge protection device, including: a first N-well disposed over a semiconductor substrate; a P-well disposed adjacent to the first N-well; a second N-well disposed adjacent to the P-well; a first P-type impurity region disposed in the first N-well and to which a power supply voltage is applied; a PMOS transistor disposed in the first N-well and comprising a first P-type impurity region to which the power supply voltage is applied, a second P-type impurity region disposed over the first N-well and the P-well, and a gate to which the power supply voltage is applied; a second N-type impurity region disposed adjacent to the second P-type impurity region in the P-well and connected to an input/output pad; a third N-type impurity region disposed in the P-well and to which the power supply voltage is applied; a third P-type impurity region disposed in the P-well and connected to the input/output pad; and a fourth N-type impurity region disposed in the second N-well and to which the power supply voltage is applied.

The third N-type impurity region and the fourth N-type impurity region may have a width ranging from approximately 0.4 μm to approximately 2 μm, and the third P-type impurity region has a width ranging from approximately 0.7 μm to approximately 2 μm.

An interval of the third N-type impurity region, the third P-type impurity region, and the fourth N-type impurity region ranges from approximately 0.6 μm to approximately 1 μm.

DESCRIPTION OF SPECIFIC EMBODIMENTS

Other objects and advantages of the present invention can be understood by the following description, and become apparent with reference to the embodiments of the present invention.

Figure 1:
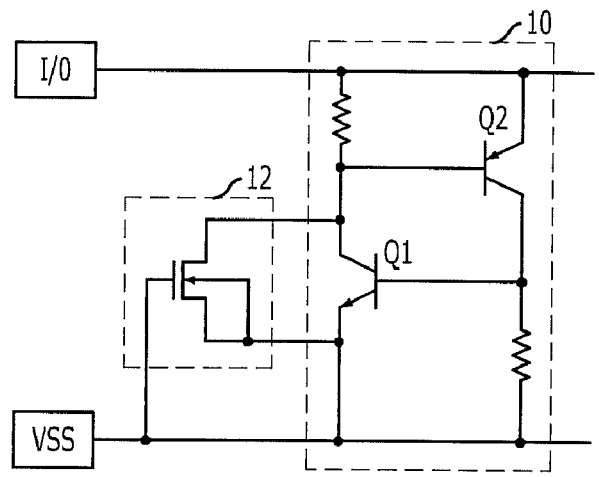
FIG. 1 is a circuit diagram of a conventional electrostatic discharge (ESD) protection device.
Figure 2:
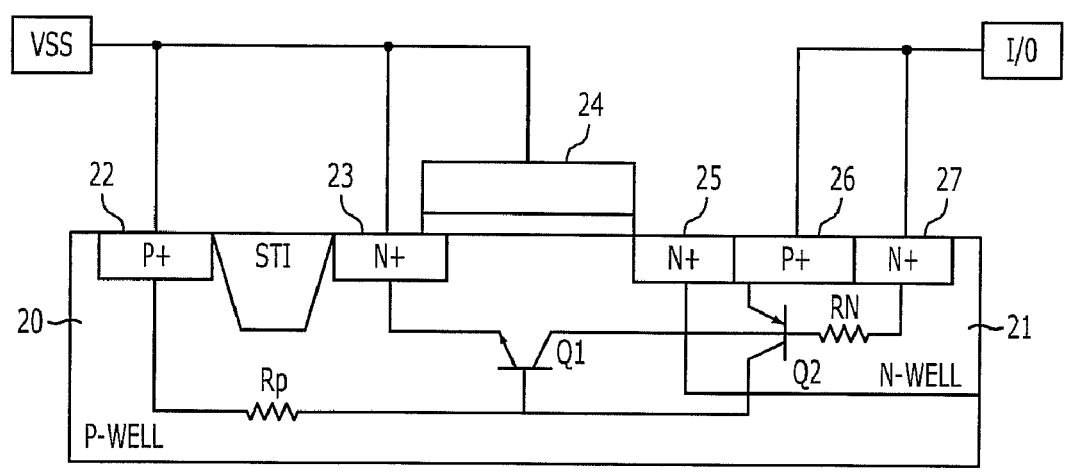
FIG. 2 is a cross-sectional view of the conventional ESD protection device of FIG. 1.
Figure 3:
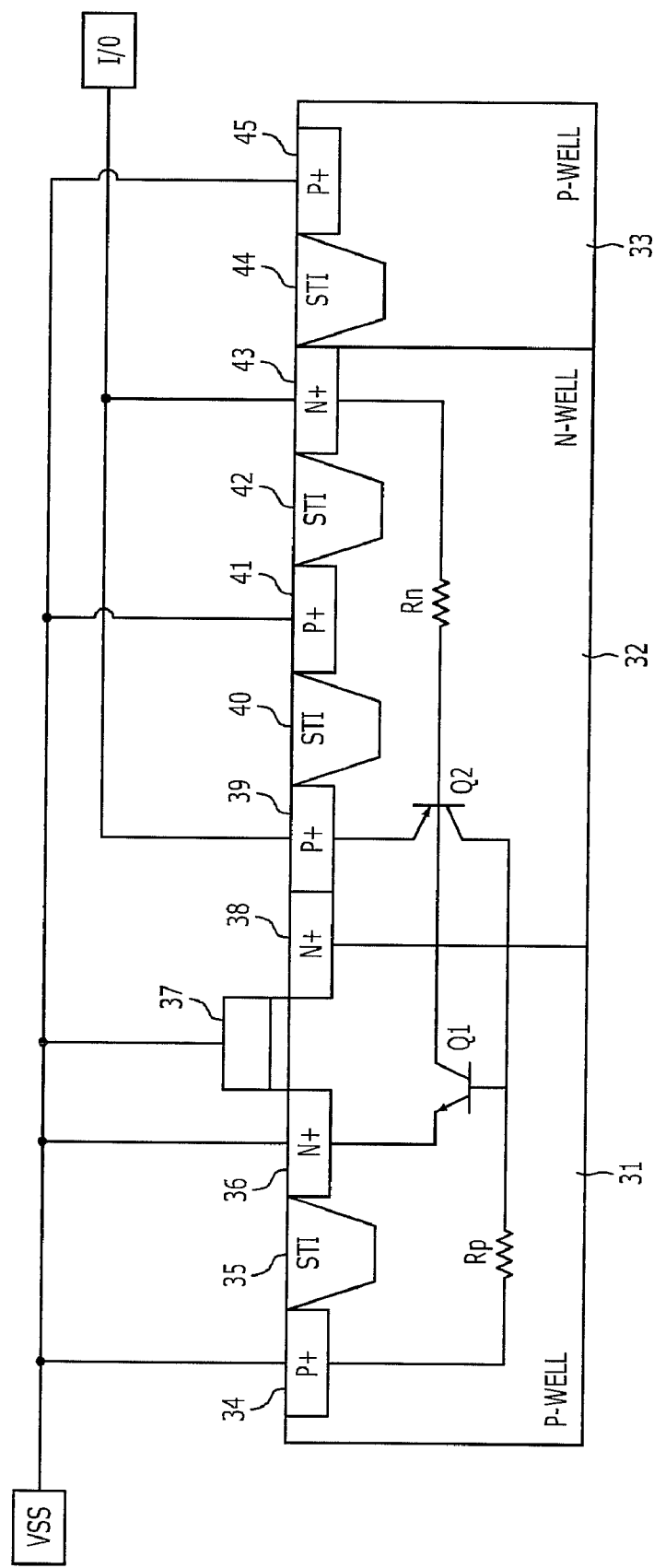
FIG. 3 is a cross-sectional view of an ESD protection device in accordance with an embodiment of the present invention.

FIG. 3 is a cross-sectional view of an ESD protection device in accordance with an embodiment of the present invention, and a circuit diagram of the ESD protection device is omitted to the extent that it is the same as the prior art. Referring to FIG. 3, the ESD protection device includes an N-well 32 between P-wells 31 and 33.

N-type impurity regions 36 and 38, and a gate 37 formed of an oxide layer and a poly layer are disposed in the P-well 31 to form an NMOS transistor. A P-type impurity region 34 is formed on the left side of the N-type impurity region 36, with a device isolation layer 35 being disposed between the P-type impurity region 34 and the N-type impurity region 36.

The N-type impurity region 38 and the P-type impurity region 39 are joined together in the N-well 32. A device isolation layer 40, a P-type impurity region 41, a device isolation layer 42, and an N-type impurity region 43 are sequentially formed in a lateral direction from the P-type impurity region 39.

A device isolation layer 44 and a P-type impurity region 45 are formed in the P-well 33 joined with the N-well 32.

A ground voltage pad VSS is connected to the P-type impurity regions 34, 41 and 45, the N-type impurity region 36, and the gate 37, and an input/output pad is connected to the P-type impurity region 39 and the N-type impurity region 43.

In such a configuration, parasitic bipolar transistors Q1 and Q2 are formed in a similar manner to the prior art. Thus, when a positive ESD voltage is applied, a voltage rise and a voltage drop occur across a resistor RP of the P-well 31 and a resistor RN of the N-well 32, respectively. As a result, the parasitic bipolar transistors Q1 and Q2 are turned on and the SCR operates to discharge static electricity.

Even when a negative ESD voltage is applied, the current drivability of the diode is improved and the ESD capability is improved, as opposed to the prior art having a problem that the current drivability is lowered by the operation of the parasitic diode.

More specifically, the P-type impurity region 41 and the N-type impurity region 43 of the N-well 32 and the P-type impurity region 45 of the P-well 33 form PN junction diodes. That is, the P-type impurity regions 41 and 45 function as anodes, and the N-type impurity region 43 functions as a cathode.

In the prior art, on-resistance increases because of the long distance between the anode region and the cathode region, and thus, the current drivability of the diode is lowered. However, in accordance with the embodiment of the present invention, on-resistance decreases because of the short distance between the anode and the cathode, and thus, the ESD protection device operates even at a small ESD current.

When an excessive ESD current is applied through the ground voltage pad VSS, electric current flows from the P-type impurity regions 41 and 45 to the N-type impurity region 43 and those impurity regions operate as diodes. That is, since two current paths are formed, the current drivability is improved.

In this case, optimal widths of the impurity regions can be set by changing them variously. The N-type impurity region 43 may have an active width ranging from approximately 0.7 µm to approximately 2 µm, and the P-type impurity regions 41 and 45 may have an active width ranging from approximately 0.4 µm to approximately 2 µm. The intervals of the N-type impurity region 43 and the P-type impurity regions 41 and 45 may range from approximately 0.6 µm to approximately 1 µm.

Figure 4:
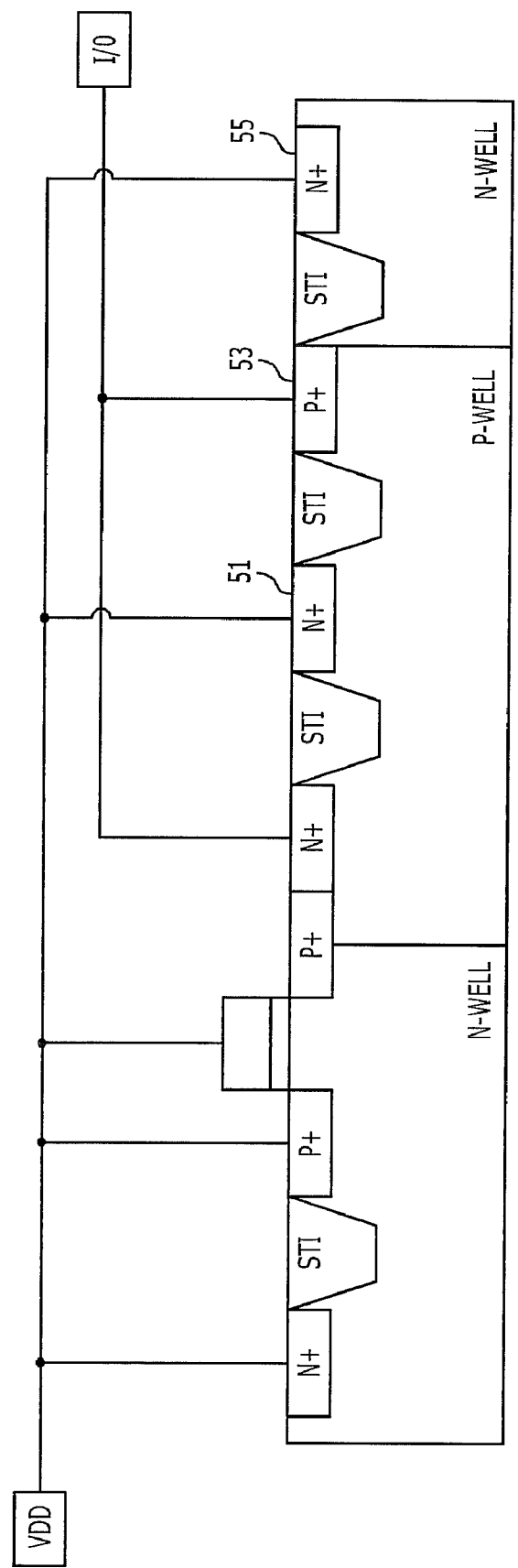
FIG. 4 is a cross-sectional view of an ESD protection device in accordance with another embodiment of the present invention.

FIG. 4 is a cross-sectional view of an ESD protection device formed on an N-type substrate in accordance with another embodiment of the present invention.

The structure of FIG. 4 is the same as that of FIG. 3, except for opposite polarities. Thus, operation characteristic of FIG. 4 is opposite to that of FIG. 3. That is, when a negative ESD current is applied, the SCR operates, and when a positive ESD current is applied through the input/output pad, a diode is turned on in response. Thus, the applied ESD current flows through the N-type impurity regions 51 and 55 and the P-type impurity region 53.

In accordance with the embodiments of the present invention, since the PN diode is further provided, an area may increase slightly, but the capability of the diode can be greatly improved and the ESD effect can be maximized.

By adding a diode to the SCR, the current drivability of the diode can be improved even when negative ESD is applied. Thus, the capability of the ESD protection device can be improved.

While the present invention has been described with respect to the specific embodiments, it will be apparent to those skilled in the art that various changes and modifications may be made without departing from the spirit and scope of the invention as defined in the following claims.

What is claimed is:

1. An electrostatic discharge protection device, comprising:
    a first well comprising a MOS transistor;
    a second well comprising a first impurity region to which a first voltage is applied, and a second impurity region connected to an input/output pad, the second well being disposed adjacent to the first well; and
    a third well comprising a third impurity region to which the first voltage is applied, the third well being disposed adjacent to the second well.

2. The electrostatic discharge protection device of claim 1, wherein the first well further comprises a fourth impurity region to which the first voltage is applied.

3. The electrostatic discharge protection device of claim 1, wherein the second well further comprises a fifth impurity region adjacent to a drain region of the MOS transistor and connected to the input/output pad.

4. The electrostatic discharge protection device of claim 3, further comprising:
    a first device isolation layer disposed between the first impurity region and the fourth impurity region; and
    a second device isolation layer disposed between the first impurity region and the second impurity region.

5. The electrostatic discharge protection device of claim 1, further comprising a third device isolation layer disposed between the second impurity region and the third impurity region.

6. The electrostatic discharge protection device of claim 1, wherein the first impurity region and the third impurity region have a width ranging from approximately 0.4 µm to approximately 2 µm, and the second impurity region has a width ranging from approximately 0.7 µm to approximately 2 µm.

7. The electrostatic discharge protection device of claim 1, wherein an interval of the impurity regions ranges from approximately 0.6 µm to approximately 1 µm.

8. The electrostatic discharge protection device of claim 1, wherein the first well and the third well are each a P-well, and the second well is an N-well.

9. The electrostatic discharge protection device of claim 1, wherein the first impurity region and the third impurity region are each a P-type impurity region, and the second impurity region is an N-type impurity region.

10. The electrostatic discharge protection device of claim 2, wherein the fourth impurity region is a P type impurity region.

11. The electrostatic discharge protection device of claim 3, wherein the fifth impurity region is a P-type impurity region.

12. The electrostatic discharge protection device of claim 8, wherein the first voltage is a ground voltage.

13. The electrostatic discharge protection device of claim 1, wherein the first impurity region and the third impurity region are each an N-type impurity region, and the second impurity region is a P-type impurity region.

14. The electrostatic discharge protection device of claim 2, wherein the fourth impurity region is an N-type impurity region.

15. The electrostatic discharge protection device of claim 3, wherein the fifth impurity region is an N-type impurity region.

16. The electrostatic discharge protection device of claim 13, wherein the first voltage is a power supply voltage.

17. An electrostatic discharge protection device, comprising:
    a first P-well disposed over a semiconductor substrate;
    an N-well disposed adjacent to the first P-well;
    a second P-well disposed adjacent to the N-well;
    a first P-type impurity region disposed in the first P-well and to which a ground voltage is applied;
    an NMOS transistor disposed in the first P-well and comprising a first N-type impurity region to which the ground voltage is applied, a second N-type impurity region disposed over the first P-well and the N-well, and a gate to which the ground voltage is applied;

a second P-type impurity region disposed adjacent to the second N-type impurity region in the N-well and connected to an input/output pad;

a third P-type impurity region disposed in the N-well and to which the ground voltage is applied;

a third N-type impurity region disposed in the N-well and connected to the input/output pad; and a fourth P-type impurity region disposed in the second P-well and to which the ground voltage is applied.

18. The electrostatic discharge protection device of claim 17, wherein the third P-type impurity region and the fourth P-type impurity region have a width ranging from approximately 0.4 μm to approximately 2 μm, and the third N-type impurity region has a width ranging from approximately 0.7 μm to approximately 2 μm.

19. The electrostatic discharge protection device of claim 17, wherein an interval of the third P-type impurity region, the third N-type impurity region, and the fourth P-type impurity region ranges from approximately 0.6 μm to approximately 1 μm.

20. An electrostatic discharge protection device, comprising:

a first N-well disposed over a semiconductor substrate;
a P-well disposed adjacent to the first N-well;
a second N-well disposed adjacent to the P-well;
a first N-type impurity region disposed in the first N-well and to which a power supply voltage is applied;

a PMOS transistor disposed in the first N-well and comprising a first P-type impurity region to which the power supply voltage is applied, a second P-type impurity region disposed over the first N-well and the P-well, and a gate to which the power supply voltage is applied;

a second N-type impurity region disposed adjacent to the second P-type impurity region in the P-well and connected to an input/output pad;

a third N-type impurity region disposed in the P-well and to which the power supply voltage is applied;

a third P-type impurity region disposed in the P-well and connected to the input/output pad; and a fourth N-type impurity region disposed in the second N-well and to which the power supply voltage is applied.

21. The electrostatic discharge protection device of claim 20, wherein the third N-type impurity region and the fourth N-type impurity region have a width ranging from approximately 0.4 μm to approximately 2 μm, and the third P-type impurity region has a width ranging from approximately 0.7 μm to approximately 2 μm.

22. The electrostatic discharge protection device of claim 20, wherein an interval of the third N-type impurity region, the third P-type impurity region, and the fourth N-type impurity region ranges from approximately 0.6 μm to approximately 1 μm.

* * * * *